United States Patent
Zachariasse et al.

(10) Patent No.: US 11,922,244 B2
(45) Date of Patent: Mar. 5, 2024

(54) STORAGE DEVICE AND METHOD OF PRODUCING THE SAME

(71) Applicant: NXP B.V., Eindhoven (NL)

(72) Inventors: Frank Zachariasse, Berlicum (NL); Slawomir Rafal Malinowski, Graz (AT); Egas Carvalho Henes Neto, Graz (AT); Shafqat Ali, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/808,125

(22) Filed: Jun. 22, 2022

(65) Prior Publication Data
US 2023/0004770 A1   Jan. 5, 2023

(30) Foreign Application Priority Data
Jul. 2, 2021   (EP) .................................... 21183406

(51) Int. Cl.
*G06K 19/07* (2006.01)
(52) U.S. Cl.
CPC ............................... *G06K 19/0715* (2013.01)
(58) Field of Classification Search
CPC ........... G06K 19/0715; G06K 7/10336; G06K 19/0702; G06K 7/0008; G06K 19/0723; G06K 19/0701; G06K 19/07749; G06K 19/07381; G06K 19/07735; G02F 1/13613; G02F 1/157; G02F 1/1362; H05B 45/12
See application file for complete search history.

(56) References Cited

U.S. PATENT DOCUMENTS

| | | | |
|---|---|---|---|
| 3,703,669 A | 11/1972 | London | |
| 4,876,583 A | 10/1989 | Hughes et al. | |
| 6,021,063 A | 2/2000 | Tai | |
| 6,369,426 B2 | 4/2002 | Blanchard et al. | |
| 6,380,530 B1 * | 4/2002 | Afghahi | H01L 27/14609 250/214 R |
| 8,803,592 B2 * | 8/2014 | Chung | H03K 3/012 327/537 |
| 9,218,519 B2 | 12/2015 | Hadley et al. | |
| 2015/0221363 A1 | 8/2015 | Krilic | |

(Continued)

FOREIGN PATENT DOCUMENTS

| | | | | |
|---|---|---|---|---|
| WO | 99/30368 A1 | 6/1999 | | |
| WO | WO-2014050694 A1 * | 4/2014 | ........... | H01L 25/167 |

OTHER PUBLICATIONS

Yang et al., Electrical Switching and Bistability in Organic/Polymeric Thin Films and Memory Devices (Year: 2006).*

(Continued)

*Primary Examiner* — Thien T Mai

(57) ABSTRACT

In accordance with a first aspect of the present disclosure, a storage device is provided, comprising: a capacitor configured to be charged; a charge circuit configured to charge said capacitor; a pass device coupled between the charge circuit and the capacitor; a control circuit configured to control said pass device; a photosensitive diode coupled between the control circuit and the pass device, such that an input voltage provided by the control circuit to the pass device is reduced if the storage device is exposed to light. In accordance with a second aspect of the present disclosure, a corresponding method of producing a storage device is conceived.

18 Claims, 3 Drawing Sheets

(56) References Cited

U.S. PATENT DOCUMENTS

2016/0294481 A1* 10/2016 Friedman .......... G06K 7/10316
2020/0346004 A1 11/2020 Cappy et al.

OTHER PUBLICATIONS

GS1 EPCglobal Inc.; "EPC™ Radio-Frequency Identity Protocols Generation-2 UHF RFID" Specification for RFID Air Interface, Protocol for Communications at 860 MHz-960 MHz; ; Version 2.0.1, Published Apr. 2015.

* cited by examiner

US 11,922,244 B2

STORAGE DEVICE AND METHOD OF PRODUCING THE SAME

CROSS-REFERENCE TO RELATED APPLICATIONS

This application claims priority under 35 U.S.C. § 119 to European Patent Application No. 21183406.4, filed on Jul. 2, 2021, the contents of which are incorporated by reference herein.

TECHNICAL FIELD

The present disclosure relates to a storage device. Furthermore, the present disclosure relates to a corresponding method of producing a storage device.

BACKGROUND

Storage devices based on the principle of maintaining a predefined charge on a capacitor are widely used. For instance, such storage devices may be used as so-called persistent flags in transponders. Nowadays, radio frequency identification (RFID) transponders are widely used, in different areas of industry and commerce and for various purposes. RFID transponders may for example be embodied as so-called RFID tags or RFID cards. It is noted that, in the present disclosure, near field communication (NFC) transponders are regarded as a specific type of RFID transponders. Thus, the principles described herein may also be applied to NFC transponders.

SUMMARY

In accordance with a first aspect of the present disclosure, a storage device is provided, comprising: a capacitor configured to be charged; a charge circuit configured to charge said capacitor; a pass device coupled between the charge circuit and the capacitor; a control circuit configured to control said pass device; a photosensitive diode coupled between the control circuit and the pass device, such that an input voltage provided by the control circuit to the pass device is reduced if the storage device is exposed to light.

In one or more embodiments, the pass device comprises a drain coupled to the charge circuit, a source coupled to the capacitor, and a gate coupled to the control circuit, and said input voltage is the gate voltage of the pass device.

In one or more embodiments, reducing the input voltage causes a layer of holes to be created around the source.

In one or more embodiments, the photosensitive diode contains a cathode terminal which is implemented as an n-well region connected to the gate and an anode terminal implemented as a p-substrate.

In one or more embodiments, the p-substrate is a p-substrate of a transponder in which the storage device is included.

In one or more embodiments, the transponder is a radio frequency identification transponder or a near field communication transponder.

In one or more embodiments, the device further comprises an output circuit coupled between the pass device and the capacitor, wherein the output circuit is configured to output a voltage present on the capacitor.

In one or more embodiments, a charging state of the capacitor represents information to be retained, in particular a bit.

In one or more embodiments, a transponder, in particular a radio frequency identification transponder or a near field communication transponder, comprises a storage device of the kind set forth.

In accordance with a second aspect of the present disclosure, a method of producing a storage device is conceived, the method comprising providing the storage device with: a capacitor configured to be charged; a charge circuit configured to charge said capacitor; a pass device coupled between the charge circuit and the capacitor; a control circuit configured to control said pass device; a photosensitive diode coupled between the control circuit and the pass device, such that an input voltage provided by the control circuit to the pass device is reduced if the storage device is exposed to light.

In one or more embodiments, the pass device comprises a drain coupled to the charge circuit, a source coupled to the capacitor, and a gate coupled to the control circuit, and said input voltage is the gate voltage of the pass device.

In one or more embodiments, reducing the input voltage causes a layer of holes to be created around the source.

In one or more embodiments, the photosensitive diode contains a cathode terminal which is implemented as an n-well region connected to the gate and an anode terminal implemented as a p-substrate.

In one or more embodiments, the p-substrate is a p-substrate of a transponder in which the storage device is included.

In one or more embodiments, the transponder is a radio frequency identification transponder or a near field communication transponder.

DESCRIPTION OF DRAWINGS

Embodiments will be described in more detail with reference to the appended drawings, in which.

DESCRIPTION OF EMBODIMENTS

As mentioned above, storage devices based on the principle of maintaining a predefined charge on a capacitor are widely used. For instance, such storage devices may be used as so-called persistent flags in transponders. Nowadays, radio frequency identification (RFID) transponders are widely used, in different areas of industry and commerce and for various purposes. RFID transponders may for example be embodied as so-called RFID tags or RFID cards. It is noted that, in the present disclosure, near field communication (NFC) transponders are regarded as a specific type of RFID transponders. Thus, the principles described herein may also be applied to NFC transponders.

Persistent flags are a feature related to the RFID technology. The persistent flags have the function to retain the inventory state information of a transponder for a predetermined or predefined time. This predetermined time is often referred to as the persistence time. The function and the time requirements of each persistent flag are specified in a protocol, which is an industry standard defining the communication between a reader and a transponder, and vice versa. Such a protocol is for example defined in the document *EPC™ Radio-Frequency Identity Protocols Generation*-2 *UHF RFID*, version 2.0.1, published in April 2015. It is noted that reference is made to a tag in the examples and embodiments described herein. However, the presently disclosed storage device may also be used in other types of transponders or other devices.

Figure 1:
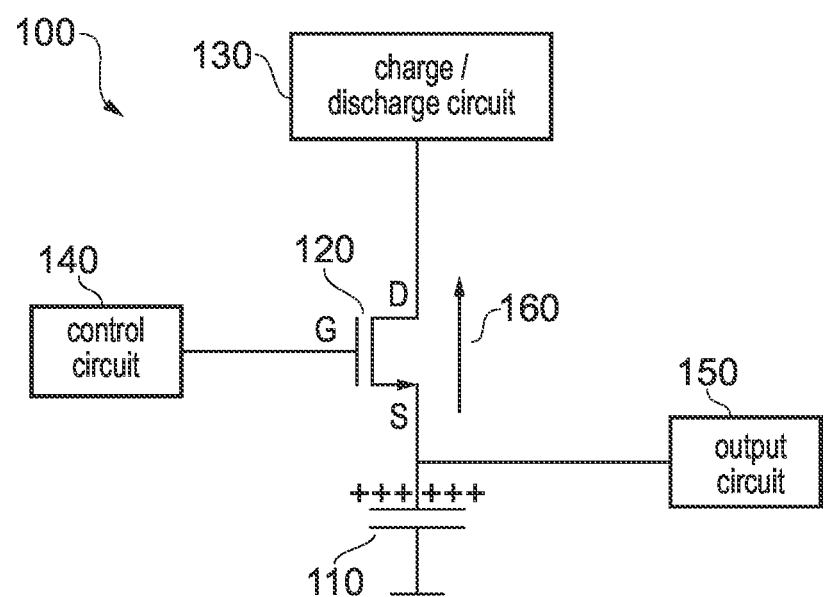
FIG. 1 shows an example of a storage device.

FIG. 1 shows an example of a storage device 100. In particular, FIG. 1 shows a possible implementation of a persistent flag, such as described in U.S. 8,803,592 B2. The implementation is formed by a capacitor 110, a pass device 120, a charge/discharge circuit 130, a control circuit 140 and an output circuit 150. During the normal operation of a tag, in other words, when the tag is powered, the persistence flag can be set or reset. The set operation is performed by charging the capacitor 110 by enabling control through both the charge circuit 130 and the control circuit 140. The resulting charged voltage across the capacitor 110 is defined by the voltage applied at the gate and drain terminals of the pass device 120 and the threshold voltage of the pass device 120. The persistence time, which is associated with the charged voltage across the capacitor 110, is counted from the time when the tag becomes unpowered to the time when the voltage across the capacitor 110 falls below the threshold of a comparison function of the output circuit 150.

Figure 2:
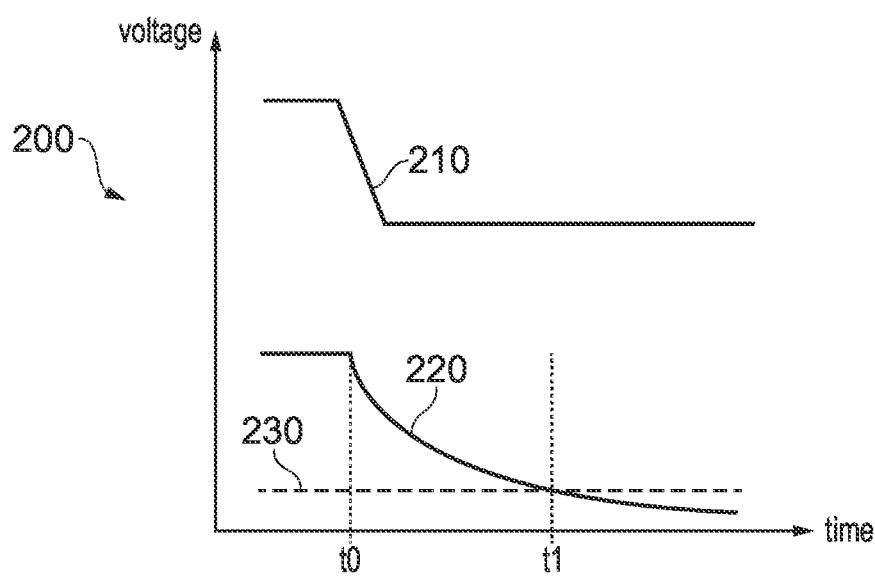
FIG. 2 shows an example of a persistence time associated with a storage device.

FIG. 2 shows an example of a persistence time 200 associated with the storage device 100 shown in FIG. 1. In particular, the time diagram shows that at t0 the tag becomes unpowered 210 and that consequently the voltage across the previously charged capacitor starts to decrease 220. At t1, the voltage across the capacitor falls below the threshold 230 of the comparison function of the output circuit. The persistence time is defined as the difference t1–t0. The parameters which influence the persistence time are the charge in the capacitor and the leakage current connected to the capacitor. In the circuit implementation illustrated in FIG. 1, the dominant current leakage source is the channel leakage of the pass device, which is an NMOS pass device.

Storage devices of the kind set form may be sensitive to light. For instance, it has been reported in U.S. Pat. No. 9,218,519 B2 that persistent flags are sensitive to light. This means that the persistence time can be decreased significantly when the tag is exposed to the light. Once entering in the semiconductor material, energetic photons can create electron-hole pairs, which generate charge carriers. The photo generated charge carriers will diffuse through the semiconductor bulk and part of them will reach p-n junctions, resulting in a current flow (or photocurrent) which might perturb the operation of low power circuits. Another part of the of the photo-generated charge carriers may recombine with the semiconductor material before reaching the p-n junctions, in which case no photocurrent is generated.

Figure 3:
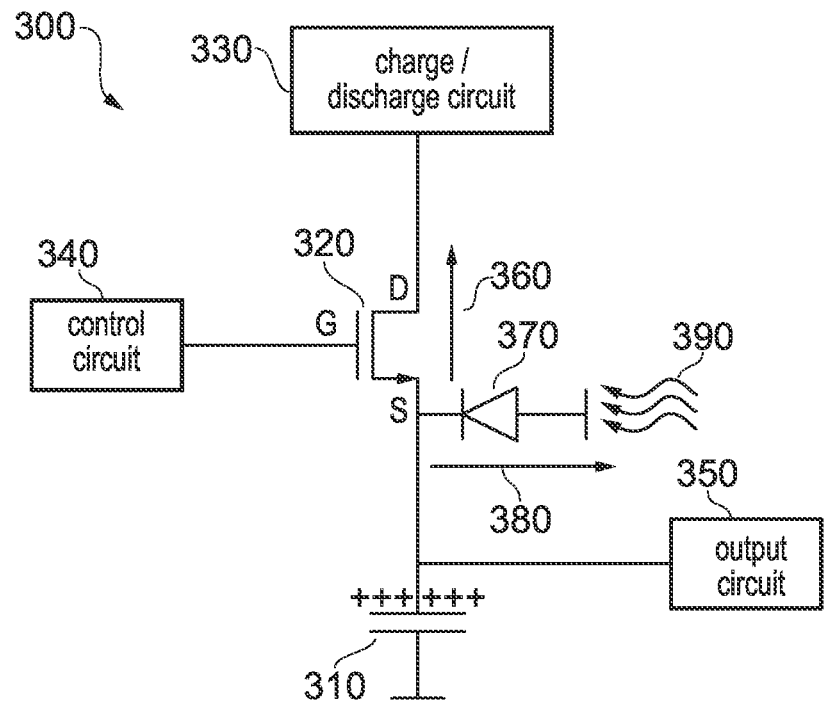
FIG. 3 shows another example of a storage device.

FIG. 3 shows another example of a storage device 300. In particular, a storage device 300 is shown whose persistence time is affected by light 390. The storage device 300 is implemented as a persistent flag, having a p-n junction 370 associated with the source terminal of the pass device 320. Since the tag is exposed to the light 390, an additional current flow, here denoted as photocurrent 380, is created through the p-n junction at the source terminal of the pass device 320. Depending on the light intensity, the photocurrent could be the dominant one once compared with the leakage 360 of the pass device, and therefore, it would reduce the charge on the storage capacitor 310 rapidly, resulting in a decreased persistence time.

Figure 4:
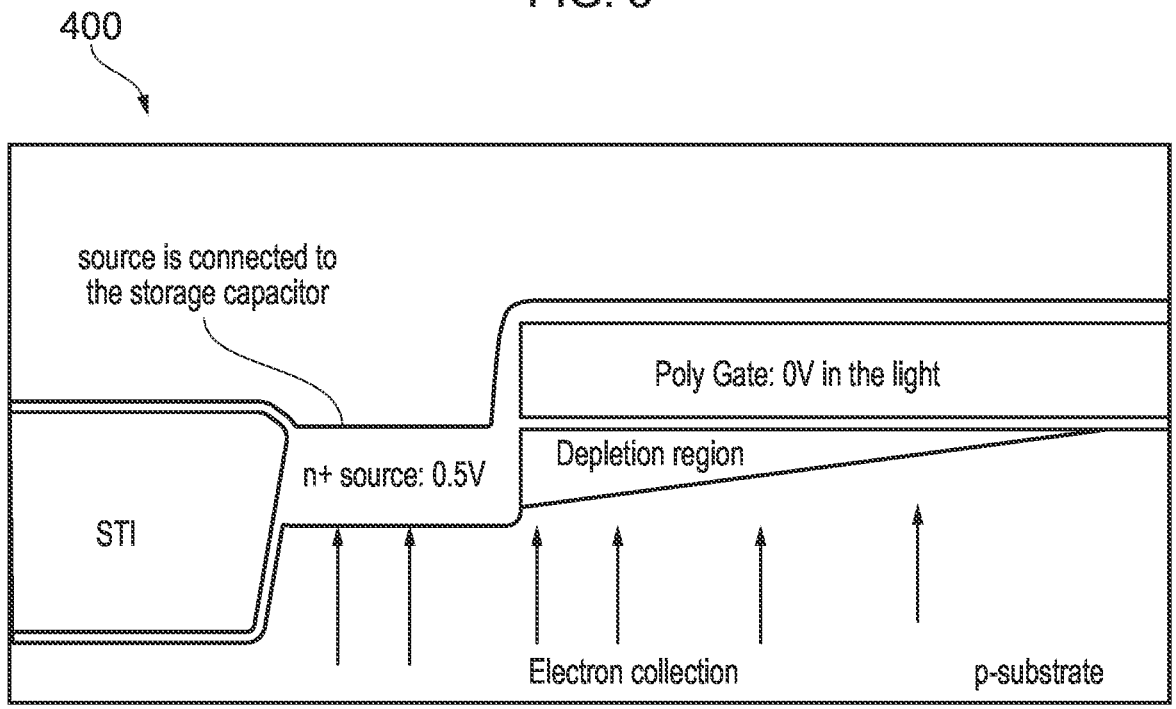
FIG. 4 shows an example of a pass device comprised in a storage device.

FIG. 4 shows an example of a pass device 400 comprised in a storage device of the kind set forth. In particular, FIG. 4 shows the cross-sectional view of the pass device presented in schematic form in FIG. 1. More specifically, it shown that in a situation in which the tag is unpowered, the gate voltage of the pass device is 0V and the storage voltage in the capacitor is 0.5V. Since the gate voltage of the pass device is 0V, a depletion region is formed under the gate. Once the tag is exposed to light, the depletion region contributes to increasing the electron collection area, causing an increased photocurrent and a decreased persistence time.

Now discussed are a storage device and a corresponding method of producing a storage device, which facilitate maintaining the persistence time at an acceptable level. In particular, the presently disclosed storage device and corresponding production method facilitate avoiding that a storage capacitor included in the storage device discharges too quickly when the storage device is exposed to light.

According to a first aspect of the present disclosure, a storage device is provided. The storage device comprises a capacitor configured to be charged, a charge circuit configured to charge said capacitor, a pass device coupled between the charge circuit and the capacitor, and a control circuit configured to control said pass device. Furthermore, the storage device comprises a photosensitive diode coupled between the control circuit and the pass device, such that an input voltage provided by the control circuit to the pass device is reduced if the storage device is exposed to light. By including the photosensitive diode, it may be avoided that the capacitor discharges too quickly when the storage device is exposed to light. This, in turn, facilitates maintaining the persistence time at an acceptable level.

In one or more embodiments, the pass device comprises a drain coupled to the charge circuit, a source coupled to the capacitor, and a gate coupled to the control circuit, and the input voltage is the gate voltage of the pass device. This results in a practical implementation of a storage device, whose persistence time less is affected by light. Furthermore, in one or more embodiments, reducing the input voltage causes a layer of holes to be created around the source. For instance, said layer may be an accumulation layer. This further facilitates avoiding that the capacitor discharges too quickly when the storage device is exposed to light. In a particularly efficient implementation, the photosensitive diode contains a cathode terminal which is implemented as an n-well region connected to the gate and an anode terminal implemented as a p-substrate. Furthermore, the p-substrate may be a p-substrate of a transponder in which the storage device is included, such that a p-substrate that is already available may be reused for the purpose of reducing the light sensitivity of the storage device.

In one or more embodiments, the storage device comprises an output circuit coupled between the pass device and the capacitor, wherein the output circuit is configured to output a voltage present on the capacitor. In this way, the stored charge may easily be measurement and compared with the threshold, to output a value corresponding to, for example, a charged state or a discharged state. Accordingly, the charging state (i.e. charged or discharged) of the capacitor may represent information to be retained, in particular a bit. It is noted that the measurement function and comparison function of the output circuit may be implemented in a conventional manner.

Figure 5:
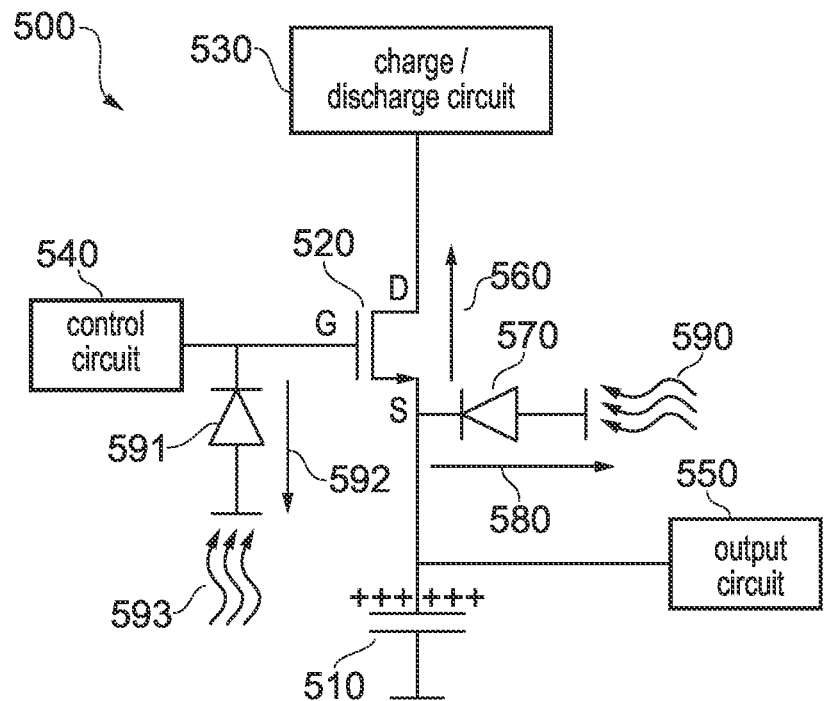
FIG. 5 shows an illustrative embodiment of a storage device.

FIG. 5 shows an illustrative embodiment of a storage device 500. In particular, FIG. 5 shows an example of an implementation of a storage device having a reduced sensitivity to light. The storage device 500 is implemented as a persistent flag, having a diode 591 placed at the gate of the pass device 520. One possible, non-limiting way to implement the diode, is to connect the gate to an n-well region in such a way that the cathode terminal of the diode is the n-well region itself, while the anode terminal of the diode is the p-substrate of the tag. The n-well region of the diode can collect photo-generated electrons 593 and consequently a current flow 592 is created in order to pull the gate terminal of the pass device 520 negative.

Figure 6:
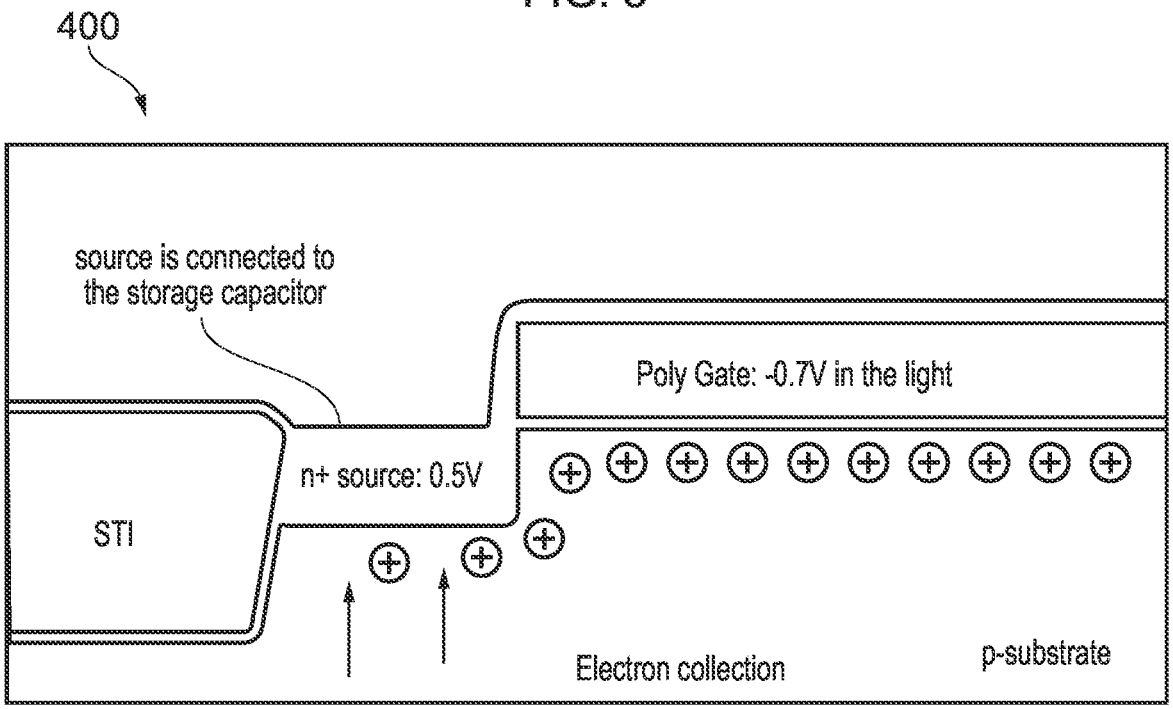
FIG. 6 shows an illustrative embodiment of a pass device comprised in a storage device.

FIG. 6 shows an illustrative embodiment of a pass device 600 comprised in a storage device in accordance with the present disclosure. In particular, FIG. 6 illustrates a cross-sectional view of the pass device presented in schematic form in FIG. 5. More specifically, it is shown that in a situation in which the tag is unpowered, the gate voltage of the pass device is −0.7V and the storage voltage in the capacitor is 0.5V. Since the gate voltage of the pass device is −0.7V, the depletion region present in the situation illustrated in FIG. 4 disappears, and an accumulation layer of holes is created around the source terminal of the pass device. Once the tag is exposed to light, the accumulation layer contributes to increasing the recombination electron-holes around the source terminal of the pass device, causing a decreased photocurrent and an increased persistence time.

Thus, the presently disclosed storage device may have the following advantage. The magnitude of the photocurrent of the p-n junction associated with the source terminal of the pass device may be reduced, by decreasing the gate voltage of the pass device at light conditions, reducing therefore the light sensitivity of the persistence time. In a practical implementation, the insertion of a photosensitive diode at the gate of the pass device of a persistent flag decreases the gate voltage (i.e. pulls it below GND) of the pass device at light conditions, reducing in this way the light sensitivity of the persistence time.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS 100 storage device
110 capacitor
120 pass device
130 charge/discharge circuit
140 control circuit
150 output circuit
160 channel leakage of the pass device
200 persistence time
210 input power
220 voltage across the capacitor
230 threshold of the output circuit
300 storage device
310 capacitor
320 pass device
330 charge/discharge circuit
340 control circuit
350 output circuit
360 channel leakage of the pass device
370 p-n junction
380 photocurrent
390 light
400 cross-sectional view of the pass device
500 storage device
510 capacitor
520 pass device
530 charge/discharge circuit
540 control circuit
550 output circuit
560 channel leakage of the pass device
570 p-n junction
580 photocurrent
590 light
591 photosensitive diode
592 current flow
593 photo-generated electrons
600 cross-sectional view of the pass device

The invention claimed is:
1. A storage device, comprising:
a capacitor configured to be charged;
a charge circuit configured to charge said capacitor;
a pass device coupled between the charge circuit and the capacitor, wherein the pass device has a drain coupled to the charge circuit, a gate, and source coupled to the capacitor, and wherein the source has a p-n junction associated therewith that produces a photocurrent in the presence of light;
a control circuit configured to control a gate voltage of said pass device;
a photosensitive diode coupled to the gate of the pass device, such that an input voltage provided by the control circuit to the gate of the pass device is reduced if the storage device is exposed to light to reduce the photocurrent of the p-n junction of the source.

2. The device of claim 1, wherein reducing the input voltage causes a layer of holes to be created around the source.

3. The device of claim 1, wherein the photosensitive diode contains a cathode terminal which is implemented as an n-well region connected to the gate and an anode terminal implemented as a p-substrate.

4. The device of claim 3, wherein the p-substrate is a p-substrate of a transponder in which the storage device is included.

5. The device of claim 4, wherein the transponder is a radio frequency identification transponder or a near field communication transponder.

6. The device of claim 1, further comprising an output circuit coupled between the pass device and the capacitor, wherein the output circuit is configured to output a voltage present on the capacitor.

7. The device of claim 1, wherein a charging state of the capacitor represents information to be retained.

8. The device of claim 7, wherein the information is a bit.

9. The storage device of claim 1, wherein the storage device is implemented in a transponder.

10. The storage device of claim 9, wherein the storage device is a radio frequency identification transponder or a near field communication transponder.

11. A method of producing a storage device, the method comprising providing the storage device with:
a capacitor configured to be charged;
a charge circuit configured to charge said capacitor;
a pass device coupled between the charge circuit and the capacitor, wherein the pass device has a drain coupled to the charge circuit, a gate, and source coupled to the capacitor, and wherein the source has a p-n junction associated therewith that generates a photocurrent in the presence of light;
a control circuit configured to control a gate voltage of said pass device;
a photosensitive diode coupled to the gate of the pass device, such that an input voltage provided by the control circuit to the gate of the pass device is reduced if the storage device is exposed to light to reduce the photocurrent of the p-n junction of the source.

12. The method of claim 11, wherein reducing the input voltage causes a layer of holes to be created around the source.

13. The method of claim 11, wherein the photosensitive diode contains a cathode terminal which is implemented as an n-well region connected to the gate and an anode terminal implemented as a p-substrate.

14. The method of claim 13, wherein the p-substrate is a p-substrate of a transponder in which the storage device is included.

15. The method of claim 14, wherein the transponder is a radio frequency identification transponder or a near field communication transponder.

16. The method of claim 11, further comprising providing the storage device with an output circuit coupled between the pass device and the capacitor, wherein the output circuit is configured to output a voltage present on the capacitor.

17. The method of claim 11, wherein a charging state of the capacitor represents information to be retained.

18. The method of claim 17, wherein the information is a bit.

* * * * *